United States Patent
Yamada

(10) Patent No.: US 7,746,701 B2
(45) Date of Patent: Jun. 29, 2010

(54) SEMICONDUCTOR MEMORY DEVICE HAVING BIT LINE PRE-CHARGE UNIT SEPARATED FROM DATA REGISTER

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 12/008,416

(22) Filed: Jan. 10, 2008

(65) Prior Publication Data

US 2009/0180331 A1    Jul. 16, 2009

(51) Int. Cl.
*G11C 11/34* (2006.01)
(52) U.S. Cl. .............. 365/185.24; 365/185.25
(58) Field of Classification Search .......... 365/185.24, 365/185.25
See application file for complete search history.

(56) References Cited

U.S. PATENT DOCUMENTS

| | | | |
|---|---|---|---|
| 2006/0077740 A1* | 4/2006 | Lee et al. | 365/210 |
| 2008/0117686 A1* | 5/2008 | Yamada | 365/185.21 |
| 2008/0192550 A1* | 8/2008 | Yamada | 365/185.21 |

* cited by examiner

*Primary Examiner*—Michael T Tran
(74) *Attorney, Agent, or Firm*—Dorsey & Whitney LLP

(57) ABSTRACT

A semiconductor memory device is described that can, in certain embodiments, reduce a delay in access time and/or an area of a memory cell array. In one or more embodiments, a flash memory device that includes a memory cell array, a data register, a state machine, input/output pads, a row decoder, and a column decoder. The memory cell array includes a pre-charge unit that is placed between a plurality of memory cell arrays. The pre-charge unit pre-charges a bit line in a read operation. A data register is separated from the pre-charge unit and is located away from the arrays. Write data are coupled from a data register to the arrays, and read data are coupled from the arrays to the data register.

16 Claims, 6 Drawing Sheets

SEMICONDUCTOR MEMORY DEVICE HAVING BIT LINE PRE-CHARGE UNIT SEPARATED FROM DATA REGISTER

TECHNICAL FIELD

The present invention relates to a semiconductor memory device, and, in particular, to a technique for increasing the speed capability and storage capacity of the memory device.

BACKGROUND

Associated with the rapid progress of semiconductor integration circuit techniques and the development of a higher integration of semiconductor elements, a technological revolution for a semiconductor memory devices has been in progress with the aim of gaining larger capacity and further miniaturization.

One recent problem accompanying a large capacity flash memory (on the order of gigabytes) is the extension of the length of bit lines. This causes the resistance value R of the bit line to increase and the parasitic capacity C between the bit lines to increase, thus increasing a time constant RC of the bit lines. An increase in the time constant RC results in increasing the time period required for sense amplifiers connected to the bit lines to sense voltages on the bit lines corresponding to read data and apply voltages to the bit lines corresponding to write data.

A data read operation performed in common flash memory device requires pre-charging of the bit lines. The reason is that, to confirm whether a memory cell is in an erase state "1" or program state "0", a verification of a change in potential is difficult unless the bit line is provided with a certain level of potential. A common practice is to apply a pre-charging voltage to increase the voltage of the bit line to a predetermined value in advance, followed by detecting a change in the voltage of the bit line when the bit line is applied to a memory cell by comparing the voltage of the bit line with the pre-charged voltage used as a reference. The pre-charging is performed without exception for both a read operation and a verification operation, i.e., performing a read operation to confirm that a memory cell has been properly programmed. Therefore, the time required for pre-charging has a large influence on data access time.

The problem of increased time constant RC of bit lines resulting from higher capacities can be solved to some extent by fabricating the bit lines from a low resistance material, thereby decreasing the resistance of the bit lines. However, doing so can greatly increase the cost of such memory device, thus making this approach generally unsuitable.

Another approach to solving this problem that has been proposed is to divide the memory cell array into two parts, thereby reducing the lengths of the bit lines in each array. With reference to FIG. 1, a flash memory cell array unit 101 is divided into two parts 102 and 104, and a data register unit 103 is between the memory cell arrays 102 and 104. This configuration reduces both the resistance R and parasitic capacity C of the bit line 107 to approximately half the values they would have if the array unit 101 was not divided. As a result, the time constant RC of the bit lines, which is the product of the two, is reduced to an approximately quarter of the value the time constant would be if the array unit 101 was not divided. Therefore, the array unit 101 can be accessed about four times faster.

The configuration of placing the data register unit 103 between the memory cell arrays 102 and 104 constitutes an effective method for decreasing the time constant that is the product of the resistance and parasitic capacity of a bit line and for shortening the access time. A few problems are left unsolved, however. First, placing the data register unit 103 between the arrays 102, 104 inherently positions it farther away from the state machine 105 and hence farther from the input/output pads 106. As a result, the times required for signals to be coupled between the data register unit 103 and both the state machine 105 and the input/output pads 106 can be greatly increased. This results in increasing the access time to obtain data from the bit lines. In view of the fact that the read cycle time has been shortened to levels like 50 nanoseconds in recent years, these increased access times can pose a large problem.

Another problem with placing the data register unit 103 between the memory cell arrays 102 and 104 is that doing so requires that a large number of signal lines 108 extend through the array unit 101 at one side of the array 104. The area of the array unit 101 required to accommodate all of these signal lines can greatly increase the width of the array unit 101. As a result, less surface area of the array unlit 101 is available for the array 104, which can limit the capacity of the array unit 101 and increase the cost of a memory device containing the array unit 101. There is therefore a need for an improved memory array unit and method that results in a large data storage capacity, a high operating speed and efficient use of semiconductor substrates on which memory devices are fabricated.

DETAILED DESCRIPTION

Figure 2:
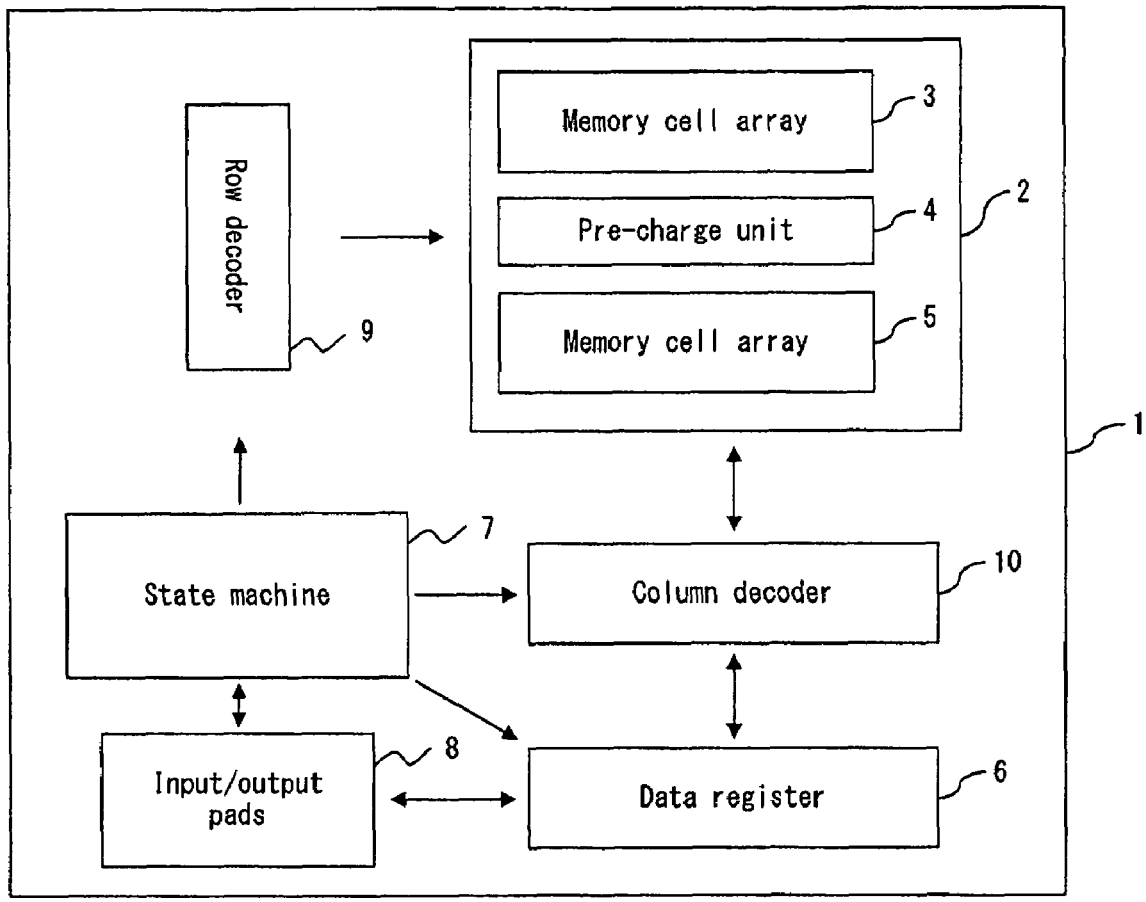
FIG. 2 is a block diagram of a flash memory device according to an embodiment of the invention.

FIG. 2 is a block diagram of a flash memory device 1 according to an embodiment of the invention. The flash memory device 1 includes a memory cell array unit 2, a data register 6, a state machine 7, input/output pads 8, a row decoder 9 and a column decoder 10. The state machine 7 may be implemented, for example, by of a controller.

The memory cell array unit 2 comprises a memory cell array 3, a memory cell array 5 and a pre-charge unit 4, which is placed between the memory cell array 3 and memory cell array 5.

The pre-charge unit 4 is connected to bit lines extending from the memory cell arrays 3, 5. The pre-charge unit pre-charges the bit lines prior to the voltages of the bit lines being sensed during a read and a verification operation.

The data register 6 is also connected to the bit lines and it includes a sense amplifier for each column of memory cells in the arrays 3, 5. The sense amplifier for a column senses a voltage of the bit line for that column, temporarily stores data for processing, and is used for writing data to the flash memory cells in the arrays 3, 5.

The state machine 7 controls the operation of the data register 6, row decoder 9 and column decoder 10, and manages the memory cell array unit 2.

The input/output pads 8 are externally accessible data terminals to couple write data to and read data from the data register 6. The input/output pads 8 may also be used to exchange information, such as information indicating the state of an input and output, with the state machine 7.

An address for accessing each memory cell of the memory cell array is divided into a row address and a column address. The row decoder 9 decodes the divided row address and selects and activates the memory cells in a corresponding row of the selected memory cell array 3 or 5. The column decoder 10 decodes the divided column address, and selects a corresponding column of memory cells in the array 3, 5 for receiving write data or transmitting read data.

Figure 1:
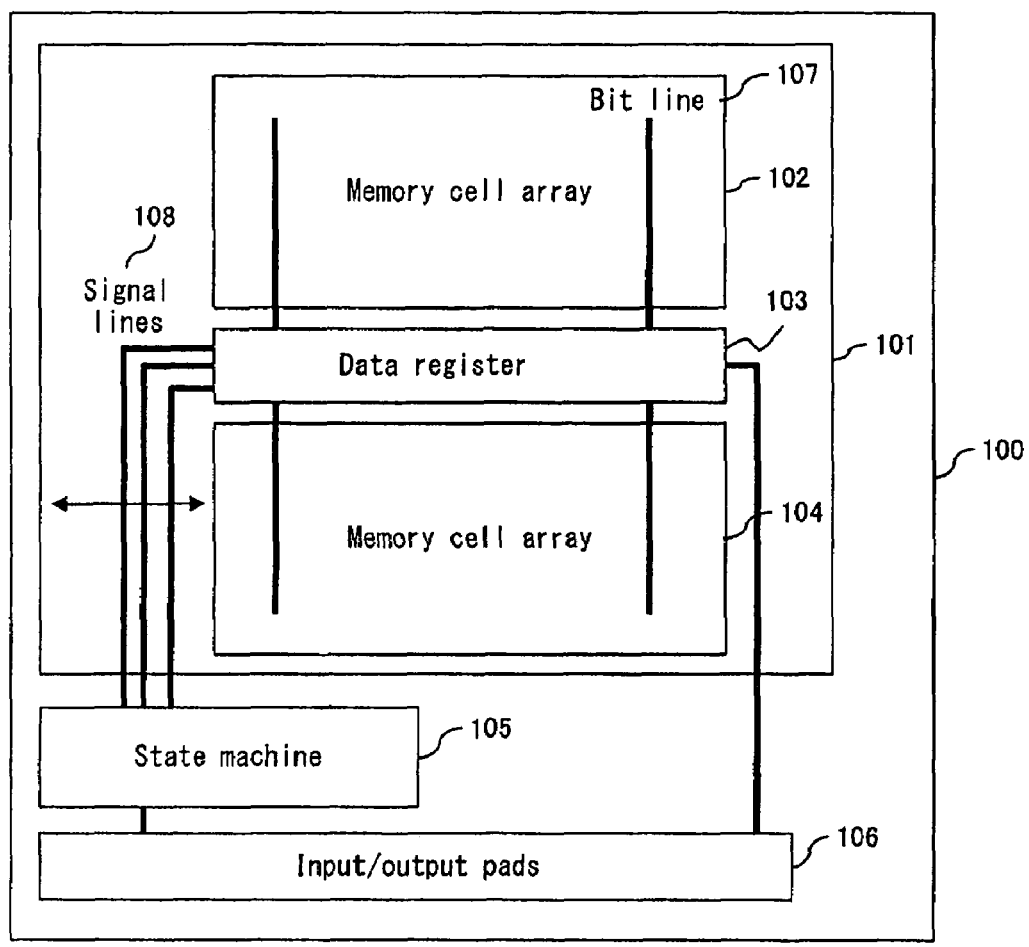
FIG. 1 is a block diagram showing a prior art flash memory device having divided memory cell arrays.

As shown in FIG. 2, the pre-charge unit 4 is divided from the data register 103 and is placed between the memory cell arrays 3, 5, in contrast to the conventional configuration shown in FIG. 1 of placing it in the data register unit 6. This configuration makes it possible to reduce the area of the memory cell array unit 2 as compared to the conventional case of placing both the data register 6 and the pre-charge unit 4 between the memory cell arrays 3, 5. Further, such a configuration can be used to eliminate the placement of the signal lines, which connect the data register 6 to the state machine 7, in the memory cell array unit 2. This configuration results in decreasing the number of signal lines existing in the memory cell array unit 2, thereby reducing the area of the semiconductor substrate required to route signals to and from the memory cell array unit 2. This in turn enables a further miniaturization and higher integration of the flash memory device 1.

The primary reason why separating the pre-charge unit 4 from the data register 6 in this manner is that it is not necessary to route control signals from the state machine 7 to the data register 6 through the memory cell array unit 2, as shown in FIG. 1. This reduction of the memory cell array, which may be reduced to only half of its original size, decreases the time constant RC of a bit line, thereby making it possible to shorten the time required for pre-charging a bit line. The reduced pre-charge time has the benefit of shortening the access time to each memory cell. Furthermore, this configuration makes it possible to place the data register 6 in the peripheral part of the memory cell array unit 2 and also close to the state machine 7, thereby shortening the time required for signals to be coupled between the data register unit 6 and the state machine 7 and input/output pads 8. This characteristic also provides the benefit of shortening the access time to each memory cell. The result is a memory device that having a larger capacity, higher integration, increased miniaturization and higher speed.

Figure 3:
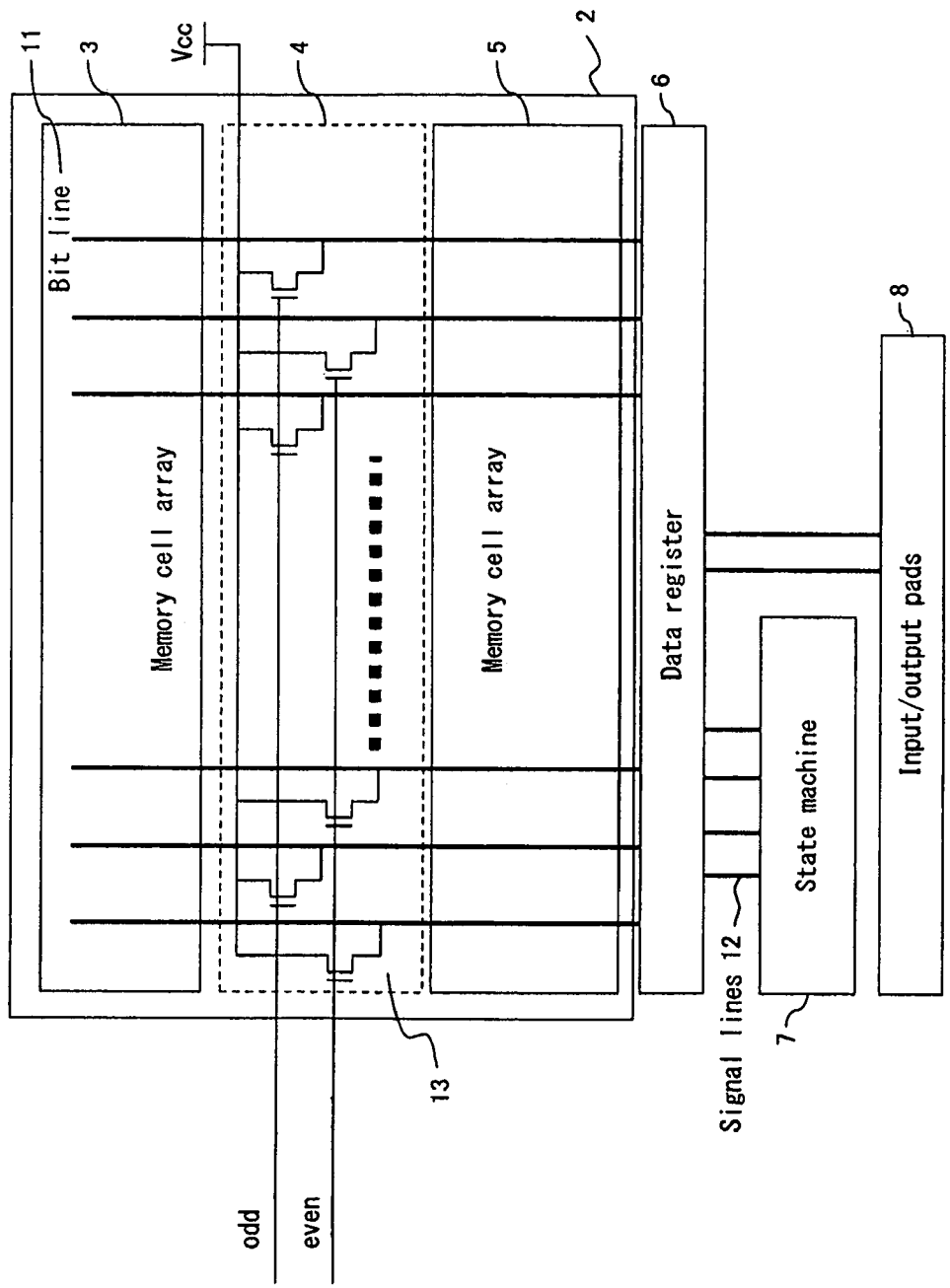
FIG. 3 is a block diagram showing a memory cell array unit according to an embodiment of the invention.

FIG. 3 is a diagram showing a memory cell array unit 2 and some associated components according to an embodiment of the invention. The memory cell array unit 2 includes the memory cell array 3, the memory cell array 5 and the pre-charge unit 4, which is placed between the memory cell array 3 and memory cell array 5.

Each of the memory cell arrays 3 and 5 includes a plurality of memory cells, bit lines 11 and word lines (not shown).

The pre-charge unit 4 includes a pre-charge transistor 13 for each bit line connected between a power supply voltage $V_{CC}$ and the bit line 11. An "odd" or "even" selection signal is input into the gate of the pre-charge transistors 13. The transistors 13 apply a voltage corresponding to the voltage applied to the "odd" line to the odd-numbered bit lines 11. Similarly, the transistors 13 apply a voltage corresponding to the voltage applied to the "even" line to the even-numbered bit lines 11. Although not shown in FIG. 3, the "odd" and "even" signals may be provided by the state machine 7. Also, each "odd" bit line 11 and adjacent "even" bit line 11 may be paired to share the same sense amplifier in the data register 6.

The data register unit 6 is connected to the bit lines 11 outside of the memory cell array unit 2. The data register 6 is controlled by the state machine 7 to receive write data bits from the input/output pads 8 and apply the bits to selected ones of the bit lines 11. The data register 6 also receives read data bits from the bit lines 11 and applies them to the input/output pads 8.

When data are to be read, the bit lines 11 are first pre-charged. Prior to being pre-charged, the bit lines are at zero volts. Appropriate voltages are then applied to the word lines (not shown in FIG. 3). More specifically, a voltage that is sufficient to turn ON the transistors in all of the memory cells regardless of their charge state is applied to all of the word lines except for a selected word line corresponding to a row address. The word line for the selected row receives a voltage that is sufficient to turn ON the transistors in the memory cells if the transistors are not storing a charge (i.e., the cells are erased or storing a "1") but insufficient to turn ON the transistors if the transistors are storing a charge (i.e., the cells are storing a "0"). Thus, if the selected memory cell has an erase state of "1", all of the memory cells transistors in the same column are turned ON to pull the voltage of the bit line 11 for that column to ground. Conversely, if the selected memory cell has an erase state of "0", it will remain OFF so that the voltage of the bit line 11 for that column will remain at the pre-charge voltage.

The above description is for a conventional two-level flash memory cell. Multi-level flash memory cells ("MLC") are also known. In an MLC flash memory device, the floating gate of each memory cell transistor may be charged to any of a plurality of levels, such as four. For example, in a 4 level MLC cell, the floating gate can be charged to any of 4 different levels corresponding to "00", "01", "10" and "11." Thus, each 4-level MLC memory cell can store two bits of data. The threshold voltage of the MLC memory cell will depend on the level of charge stored in its floating gate. For example, a 4-level MLC cell can have any of 4 different threshold voltages. The MLC cell can be read by sequentially applying different voltages to the word line connected to the control gate of the selected memory cell transistor until either the threshold voltage is exceeded or a maximum word line voltage is reached. The word line voltage required to render the memory cell transistor conductive provides an indication of its charge level and hence the bit state of the cell. The voltages of the bit lines are detected by respective sense amplifiers within the data register 6 to determine whether each memory cell in the array 3, 5 is storing a "1" or a "0."

Figure 4:
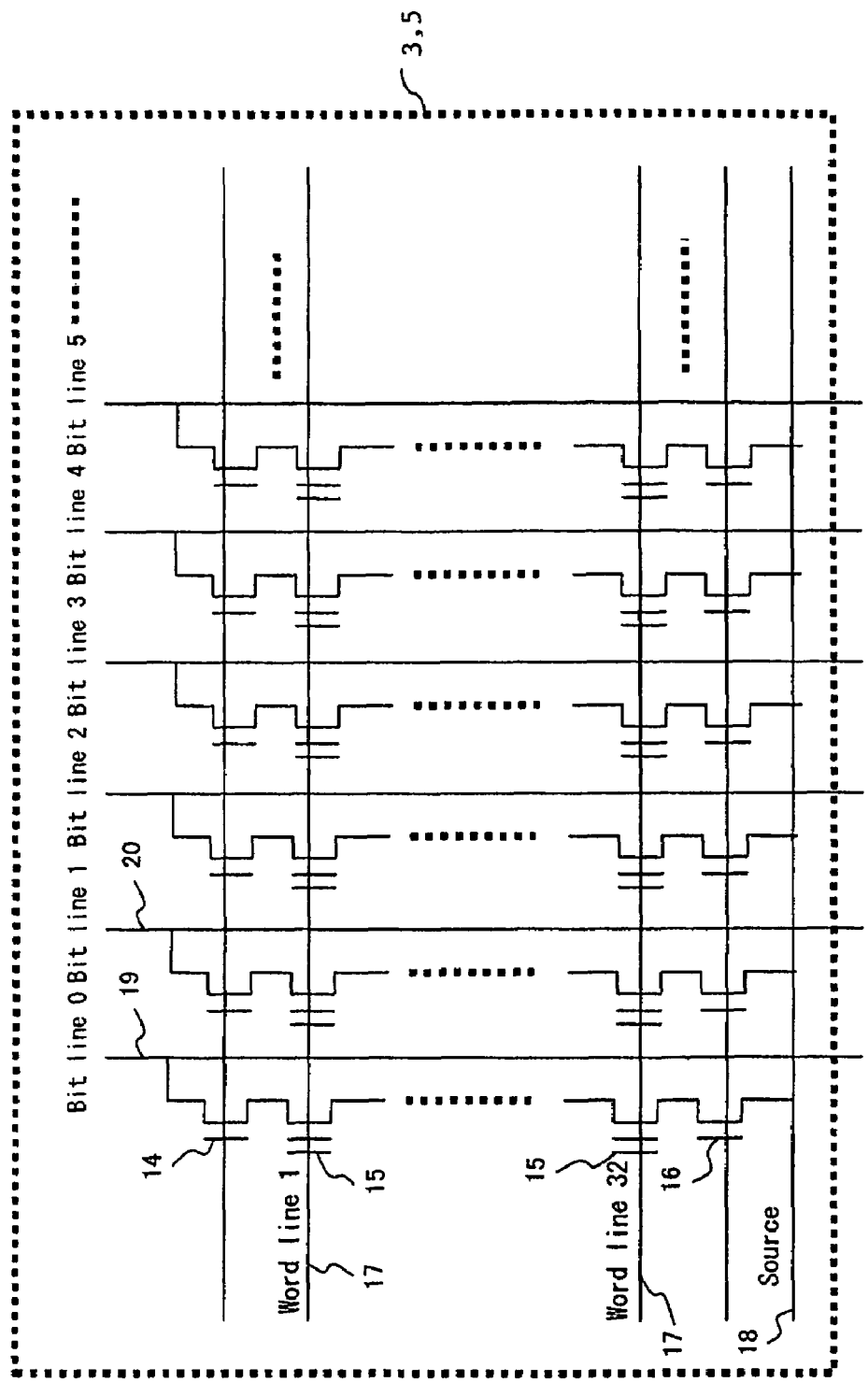
FIG. 4 is a schematic diagram showing an embodiment of a memory cell array used in the memory cell array unit of FIG. 3.

The memory cells arrays 3, 5 are shown in greater detail in FIG. 4. The arrays 3, 5 include a plurality of memory cells 15, each of which includes a source/drain, a channel-forming zone, a floating gate and a control gate. In the example shown in FIG. 4, the array 3, 5 includes a plurality of bit lines 19, 20 and 32 word lines 17. However, the number of columns or bit lines and the number of rows or word lines can vary as desired to achieve any configuration. The individual memory cells 15 in each column are connected to each other in series, and the first. As such, the individual memory cells 15 form a NAND structure. The first memory cell 15 in each column is connected to a respective odd bit line 19 or even bit line 20 by a select gate drain ("SGD") transistor 14, and the last memory cell 15 in each column is connected to a source line 18 by a select gate source ("SGS") transistor 16.

Although the embodiment shown in FIGS. 3-4 uses negative Metal Oxide Semiconductor (nMOS) type transistors, which may be fabricated in a p-type well; the transistors may be positive Metal Oxide Semiconductor (pMOS) transistors fabricated in an n-type well.

In order to write "0" to a memory cell transistor 15, a high positive voltage is applied to the control gate of the memory cell transistor, and the drain and source of the transistor are grounded. Grounding the drain and source pulls the well in which the transistor is fabricated to substantially ground, thereby creating a strong electric field from the well to the control gate. This field causes electrons to be injected into the floating gate so that a threshold voltage of the transistor rises. In contrast, in order to erase or write "1" to the memory cell transistor 15, the control gate is set to zero volts and a high voltage is applied to the well. As a result, a strong field extending from the control gate to the well is created, which causes the electron accumulated within the floating gate to be extracted by virtue of a tunnel effect so as to return the threshold voltage of the transistor to an initial state.

An MLC memory cell is programmed in a similar manner except that either the voltage applied to the control gate and the source/drain or the number of times pulses of a voltage applied to the control gate and the source/drain is controlled to impart a specific level of charge to the floating gate. This process is usually accomplished iteratively in which the charge state of the cell is normally read one or more times during the programming process until the desired charge state is achieved. This process of reading the memory cell during programming is known as "verification."

To read data from a selected memory cell in a column, the drain select transistor 14 and the source select transistor 16 in that column are turned ON after the bit line 15 has been pre-charged and the source line 18 has been connected to ground. The memory cell is then read as described above so that the bit line 19 or 20 will remain at the pre-charge level if the selected memory cell is storing a "0." If the selected memory cell is storing a "1," the bit line 19 or 20 will be pulled to ground through the source line 18.

Figure 5:
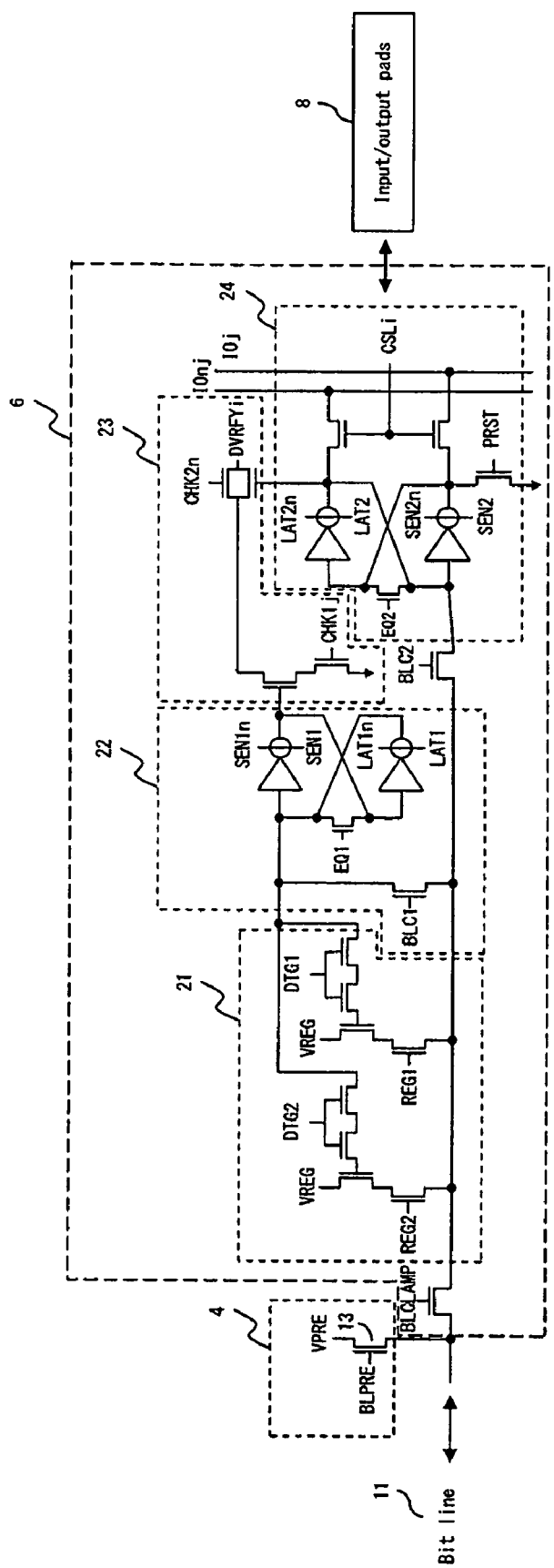
FIG. 5 is a schematic diagram showing embodiments of a pre-charge circuit and a data register according to embodiments of the invention that may be used in the flash memory device of FIG. 2.

An embodiment of the pre-charge unit 4 and the data register 6 is shown in FIG. 5. As shown in FIG. 5, the data register 6 includes a clamping transistor receiving a clamp voltage BLCLAMP, a Multi Level Cell (MLC) logic control unit 21, a bit line control unit 22, a verification detection unit 23, and data input/output control unit 24. The MLC logic control unit 21 is controlled by control signals REG1, REG2, DTG1 and DTG2, which are issued from the state machine 7, performs various controls related to a Multi Level Cell, and it receives a regulated supply voltage VREG.

The bit line control unit 22 is controlled by control signals BLC1 and EQ1, which are issued from the state machine 7, and it senses the bit state of the bit line 11 during a read operation, and it latches the sensed result.

The verification detection unit 23 is being controlled by signals CHK1j and CHK2n, which are issued from the state machine 7, to performs various controls related to a verification operation and a fail detect operation.

The data input/output control unit 24 is controlled by control signals EQ2, PRST and CSLi, which are issued from the state machine 7, to perform various controls related to a data input and output (IOnj and IOj).

The clamping transistor receiving the claim voltage BLCLAMP limits the level of the voltage that the bit line 11 can apply to the data register to the claim voltage BLCLAMP less the threshold voltage of the transistor. A second clamping transistor receives a clamping voltage BLC2 to clamp the voltage that the bit line control unit 22 applies to the verification detection unit 23.

With further reference to FIG. 5, the pre-charge unit 4is, as explained above, placed between the memory cell array 3 and memory cell array 5 of the memory cell array unit 2. A transistor 13 within the pre-charge unit 4 operates as a pre-charge transistor, which functions as a source follower. For example, when the VPRE voltage is Vcc (power supply voltage), a voltage BLPRE can be set to the sum of a threshold voltage Vth and a pre-charge voltage (e.g., 0.7 volts), is applied to the gate of the pre-charge transistors 13. The utilization of such a circuit makes it possible to pre-charge a bit line with a pre-charge voltage (or 0.7 volts).

By locating the data register 6 close to the state machine 7 rather than between the memory arrays 3, 5, the signals, e.g., REG1, REG2, DTG1, DTG2, BLC1, EQ1, CHK1j, CHK2n, EQ2, PRST and CSLi that the state machine 7 applies to the data register unit 6 need not be transmitted a long distance to the memory cell array unit 2. Therefore, the number of signals input to the memory cell array unit 2 can be reduced, thereby decreasing the width of the memory cell array unit 2. As explained above, this reduced width can enable a reduction of the area of the memory cell array unit 2.

Figure 6:
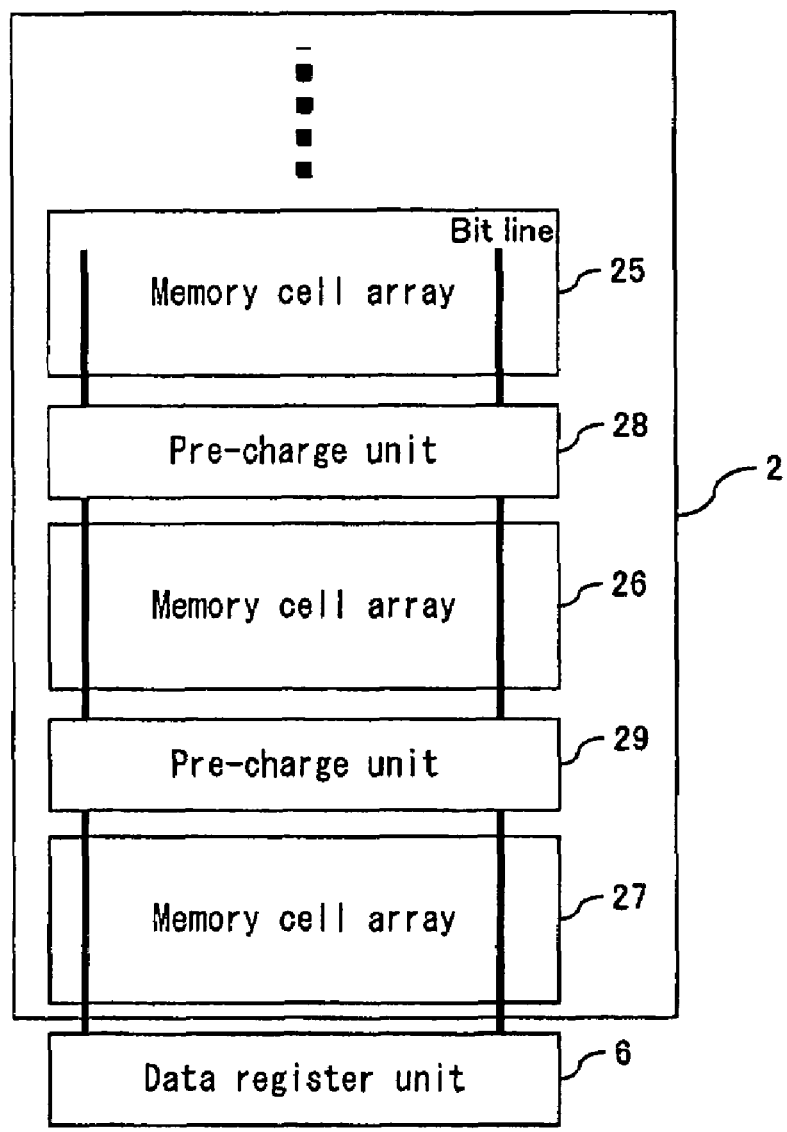
FIG. 6 is a block diagram of a memory cell array unit according to another embodiment of the invention.

A memory cell array unit 2 according to another embodiment of the invention is shown in FIG. 6. In this example, the memory cell array unit 2 includes memory cell arrays 25, 26 and 27, and pre-charge units 28 and 29. The memory cell array unit 2 is also connected to a data register unit 6 by way of the bit lines. Note that FIG. 6 does not show the state machine, input/output pads, row decoder and column decoder, which are conventional components of the flash memory. The pre-charge unit 28 is placed between the memory cell array 25 and memory cell array 26. Furthermore, the pre-charge unit 29 is placed between the memory cell array 26 and memory cell array 27. The memory cell arrays 25, 26 and 27 may be substantially identical to the memory cell arrays 3, 5 as described above, and may function in substantially the same manner. Similarly, the pre-charge units 28 and 29 may be substantially identical to the pre-charge unit 4, and it may function in substantially the same manner.

In addition to the number of memory cell arrays and pre-charge units included, the embodiment shown in FIG. 6 differs from the embodiment shown in FIG. 2 by the bit lines of the memory cell array 26 being pre-charged by two pre-charge units, namely the pre-charge unit 28 and the pre-charge unit 29.

Although the embodiment shown in FIG. 6 includes three memory cell arrays 25-27 and two pre-charge units 28, 29, the number of memory cell arrays and pre-charge units can vary as desired. By using a larger number of smaller arrays, the length of the bit lines in the arrays can be reduced, thereby making it possible to reduce the time constant RC of the bit lines to further shorten the access time to each memory cell. Also, the area of the pre-charge units 28, 29 is far smaller than the area that would be occupied if both the pre-charge units 28, 29 and the data register were positioned between the arrays 25-27. As a result, the area of the memory cell array 2 can be reduced in size. This configuration enables memory devices to have of larger capacities, higher integration, and higher flash memory speed.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device, comprising:
 a first memory cell array comprising a plurality of memory cells arranged in rows and columns, each of the columns including respective bit lines to which the memory cells in the column are selectively coupled;
 a second memory cell array comprising a plurality of memory cells arranged in rows and columns, each of the columns including respective bit lines to which the memory cells in the column are selectively coupled;
 a row decoder operable to receive a row address and to select a corresponding row of the memory cells in one of the first and second memory cell arrays in response thereto;
 a column decoder operable to receive a column address and to select a corresponding column of the memory cells in one of the first and second memory cell arrays in response thereto;
 a pre-charge unit positioned between the first and second memory cell arrays, the pre-charge unit being operable to pre-charge at least some of the bit lines in at least one of the first and second memory cell arrays; and
 a data register selectively coupled to the bit lines in the first and second memory cell arrays, the data register being positioned at a location other than between the first and second memory cell arrays and being operable to route read data from the bit lines to external data terminals and to route write data from the external data terminals to the bit lines.

2. The memory device of claim 1 wherein the pre-charge unit comprises respective pre-charge transistors coupled between a power supply and the bit lines, and wherein a pre-charge signal applied to into the respective gates of the pre-charge transistors.

3. The memory device of claim 1, further comprising a controller positioned adjacent to the data register for controlling the data register.

4. The memory device of claim 1 further comprising, in addition to the first and second memory cell arrays, a plurality of memory cell arrays each of which includes a plurality of memory cells arranged in rows and columns and respective bit lines for each of the columns to which the memory cells in the column are selectively coupled, and wherein the memory device further includes a plurality of pre-charge units each of which is positioned between a pair the memory cell arrays.

5. The memory device of claim 1 wherein each of the memory cells comprises a transistor having a floating gate and a control gate.

6. The memory device of claim 1 wherein the memory cells in each of the columns of each array are connected to each other in a NAND configuration.

7. The memory device of claim 1 wherein the memory device comprises a flash memory device.

8. A method of accessing a plurality of memory cells in an array, comprising:
 pre-charging a portion of the array from a location that is positioned adjacent the array;
 coupling data from the array to a second location that is spaced substantially farther from the array than the location from which the portion of the array is pre-charged, the data being coupled from the array to the second location without storing the data between the array and the second location; and
 storing the data coupled from the array at the second location.

9. The method of claim 8 wherein the array is divided into at least two sub-arrays, and wherein the act of pre-charging a portion of the array from a location that is positioned adjacent the array comprises pre-charging a portion of the array from a location that is between the sub-arrays.

10. The method of claim 8 wherein the memory cells are arranged in rows and columns, and a bit line provided for each of the columns is selectively coupled to the memory cells in the same column, and wherein the act of pre-charging a portion of the array from a location that is positioned adjacent the array comprises pre-charging at least some of the bit lines in the array from a location that is positioned adjacent the array.

11. The method of claim 8 wherein the memory cells comprise flash memory cells.

12. A method of writing data to a plurality of memory cells in an array in an integrated circuit memory device, comprising:
 applying write data to externally accessible terminals of the memory device;
 coupling the write data to a first location;
 storing the write data at the first location;
 coupling the stored data from the first location to memory cells in the array;
 storing the write data in the memory cells in the array; and
 pre-charging a portion of the array from a second location that is located substantially closer to the array than the first location.

13. The method of claim 12 wherein the array is divided into at least two sub-arrays, and wherein the act of pre-charging a portion of the array from a second location comprises pre-charging a portion of the array from a second location that is between the sub-arrays.

14. The method of claim 12 wherein the memory cells are arranged in rows and columns, and a bit line provided for each of the columns is selectively coupled to the memory cells in the same column, and wherein the act of pre-charging a portion of the array from a second location comprises pre-charging at least some of the bit lines in the array from the second location.

15. The method of claim 12 wherein the memory cells comprise flash memory cells.

16. The method of claim 12, further comprising coupling read data from the array to the first location, and storing the read data received from the array at the first location.

* * * * *